United States Patent
Chang

(10) Patent No.: US 6,638,093 B1
(45) Date of Patent: Oct. 28, 2003

(54) REINFORCED CONNECTOR ON AN INTEGRATED CIRCUIT CHIP

(75) Inventor: Che-Chia Chang, Taipei (TW)

(73) Assignee: Comax Technology Inc., Taipei (TW)

( * ) Notice: Subject to any disclaimer, the term of this patent is extended or adjusted under 35 U.S.C. 154(b) by 0 days.

(21) Appl. No.: 10/175,908

(22) Filed: Jun. 21, 2002

(30) Foreign Application Priority Data

Apr. 18, 2002 (TW) .................................. 91205185 U

(51) Int. Cl.[7] .............................................. H01R 13/62
(52) U.S. Cl. ................................................... 439/342
(58) Field of Search .............................. 439/342, 259, 439/260

(56) References Cited

U.S. PATENT DOCUMENTS 5,722,848 A * 3/1998 Lai et al. .................... 439/342
5,833,483 A * 11/1998 Lai et al. .................... 439/342
5,947,778 A * 9/1999 Lai et al. .................... 439/342
6,406,317 B1 * 6/2002 Li et al. ...................... 439/342

* cited by examiner

Primary Examiner—Gary Paumen
(74) Attorney, Agent, or Firm—Troxell Law Office PLLC

(57) ABSTRACT

A reinforced connector on an integrated circuit chip has a stir device with an actuation rod thereof being arranged at least one tooth part to press a resistant part of the meshing recess at the inner side of the upper cover on the connector. Therefore, when the stir device is turned to an upright position, an urging plane of the tooth part can press the resistant part of the groove wall in the meshing groove to move the upper cover toward the base seat for the upper cover being able to pressingly engage with the base seat firmly.

6 Claims, 5 Drawing Sheets

REINFORCED CONNECTOR ON AN INTEGRATED CIRCUIT CHIP

BACKGROUND OF THE INVENTION

1. Field of the Invention

The present invention relates to a reinforced connector on an integrated circuit chip, with which a stir device is turned to an upright position with an urging plane of the tooth part pressing the resistant part of the groove wall in the meshing groove so as to move the upper cover toward the base seat for the upper cover being able to pressingly engage with the base seat firmly.

2. Description of Related Art

Currently, a reinforced structure between the upper cover and the base seat of a connector on an integrated circuit is provided with a type of hook engagement to attain an engagement effect firmly. For instance, Taiwanese Patent No. 118060 discloses a hook part and an engagement part to prevent the upper cover excessively loosening from the base seat during horizontal displacement.

However, this type of engagement device not only needs a sophisticate mold tool with difficult fabrication but also is inconvenient during the process of assembly such that it is hard to disassemble the engagement device during inspection or maintenance. Further, the prior art is involved in forced press fit such that the reinforced structure becomes fracture resulting from insufficient strength at the reinforced structure because of improper force exertion or misused material. Hence, it may causes a high imperfection rate due to the preceding problems of the prior art.

SUMMARY OF THE INVENTION

Accordingly, an object of the present invention is to provide a reinforced connector on an integrated circuit chip with which a stir device is turned to an upright position with an urging plane of the tooth part pressing the resistant part of the groove wall in the meshing groove so as to move the upper cover toward the base seat for the upper cover being able to pressingly engage with the base seat firmly.

For achieving the preceding object, the reinforced connector on an integrated circuit chip according to the present invention has a stir device with an actuation rod thereof being arranged at least one tooth part to press a resistant part of the meshing recess at the inner side of the upper cover on the connector. Therefore, when the stir device is turned to an upright position, an urging plane of the tooth part can press the resistant part of the groove wall in the meshing groove to move the upper cover toward the base seat for the upper cover being able to pressingly engage with the base seat firmly.

BRIEF DESCRIPTION OF THE DRAWINGS

The present invention can be more fully understood by reference to the following description and accompanying drawings, in which:

FIG. 2-1 is an assembled perspective view of the reinforced connector on an integrated circuit chip shown in FIG. 1 illustrating a stir device therein being in a state of operating;

FIG. 2-2 is an assembled perspective view of the reinforced connector on an integrated circuit chip shown in FIG. 1 illustrating a stir device therein being in another state of operating;

FIG. 3-1 is a sectional view illustrating the state shown in FIG. 2-1; and

FIG. 3-2 is a sectional view illustrating another state of operation shown in FIG. 2-2.

DETAILED DESCRIPTION OF THE PREFERRED EMBODIMENTS

Figure 1:
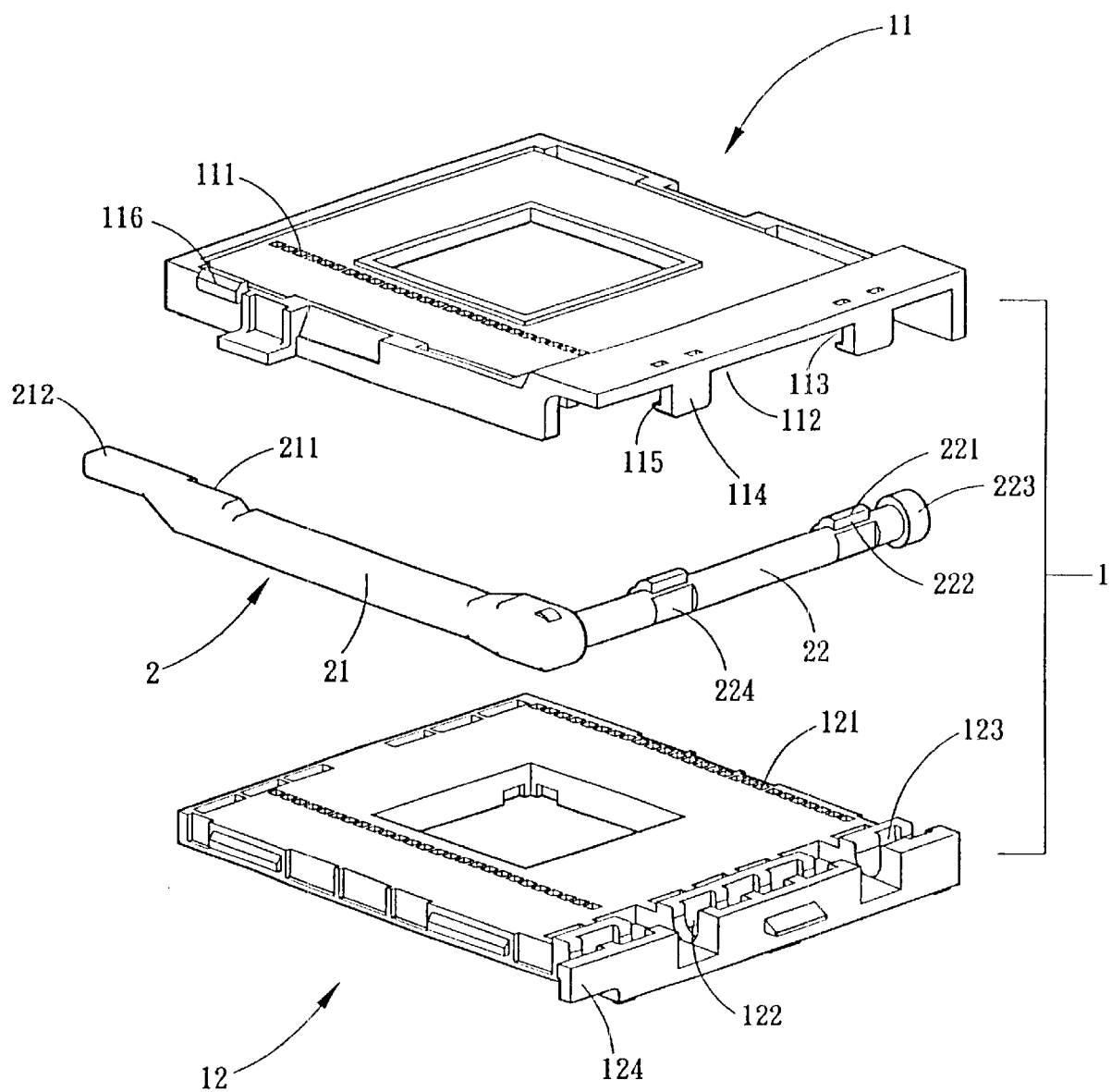
FIG. 1 is an exploded perspective view of a reinforced connector on an integrated circuit chip according to the present invention.

Referring to FIG. 1, a stir device 2 of the invention is arranged in receiving spaces 112, 122 on an upper cover 11 and a base seat 12 respectively. The stir device 2 has a push lever 21 and an actuation rod 22 and a plurality of terminal grooves 111,121 are provided on the upper cover 11 and the base seat 12.

Wherein, the actuation rod 22 on the stir device 2 is provided with at least one tooth part 221 and the tooth part 221 at a lateral side thereof has an urging plane 222. The receiving space 112 is disposed at the inner side of the upper cover 11 with a meshing recess 113 for receiving the tooth part 221. The meshing recess 113 has a recess wall 114 at the outer side thereof and the recess wall 114 at the inner side thereof has a resistant part 115 corresponding to the urging plane 222. In order to prevent the actuation rod 22 from interfering the resistant part 115, a recess part 224 can be arranged in the actuation rod 22 for facilitating the actuation rod 22 being turned.

Figures 1, 2:
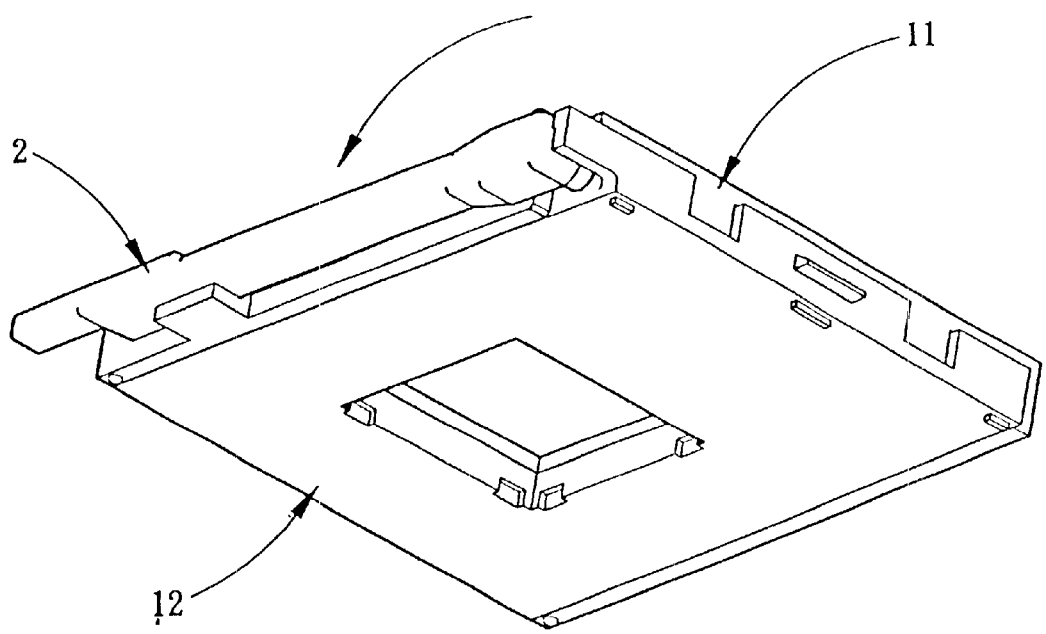
Figure 2:
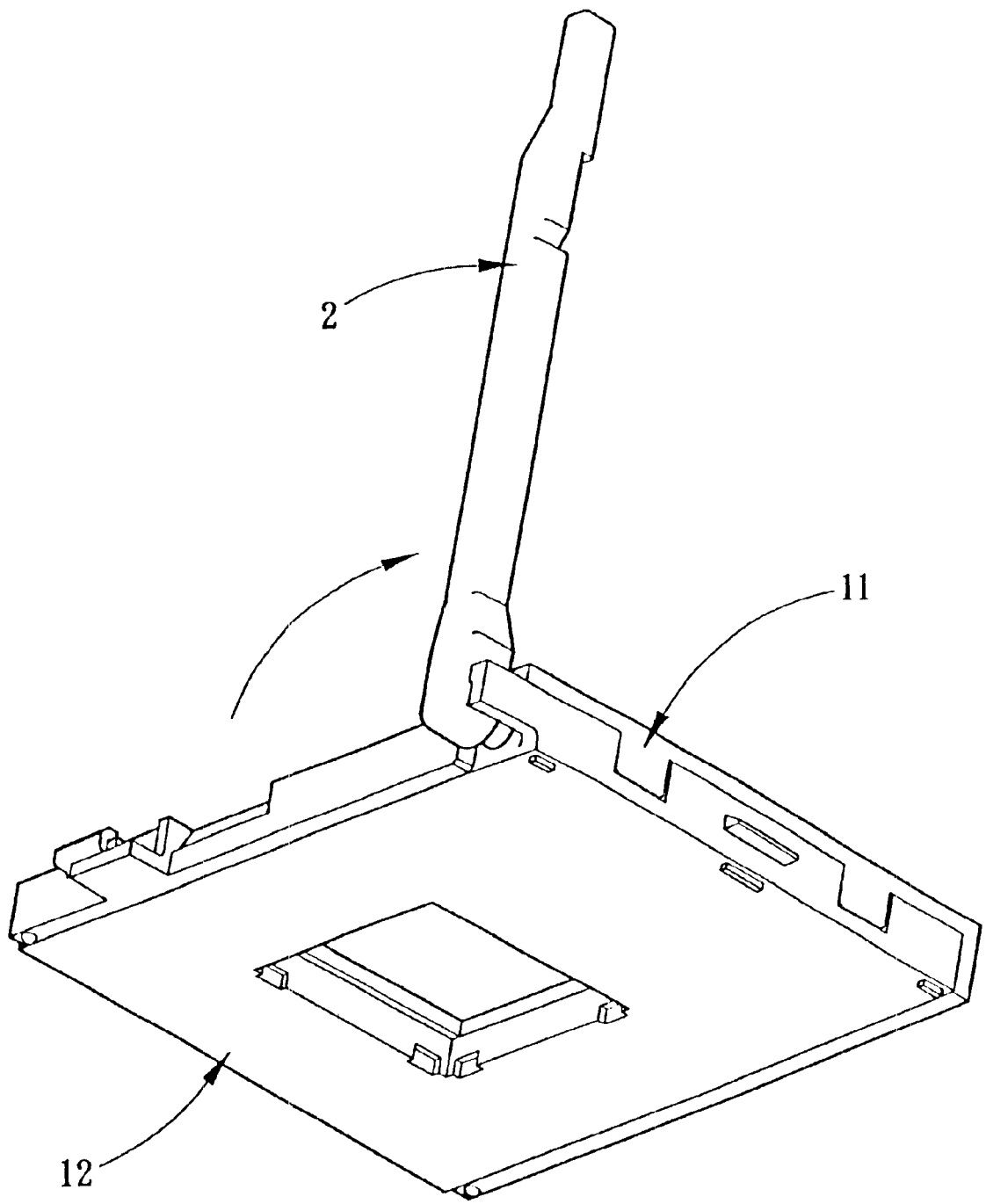
Figures 1, 3:
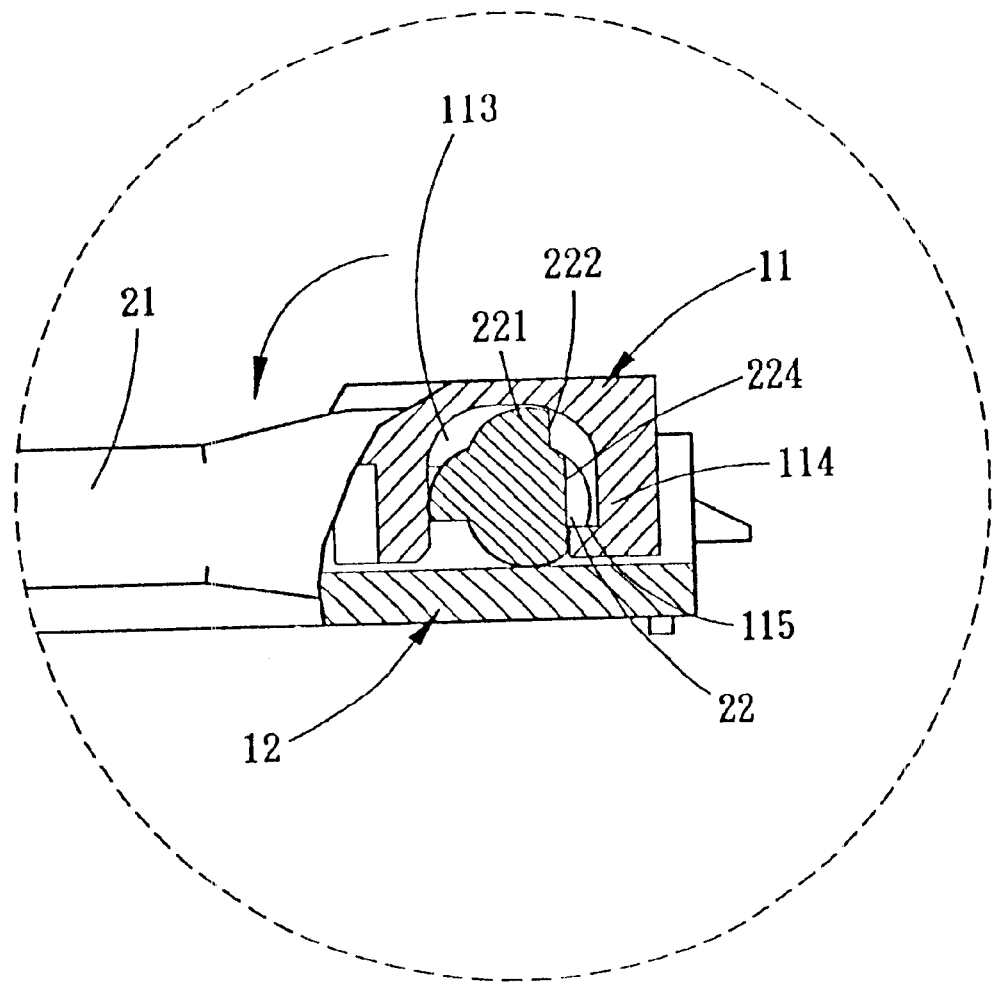
Figures 2, 3:
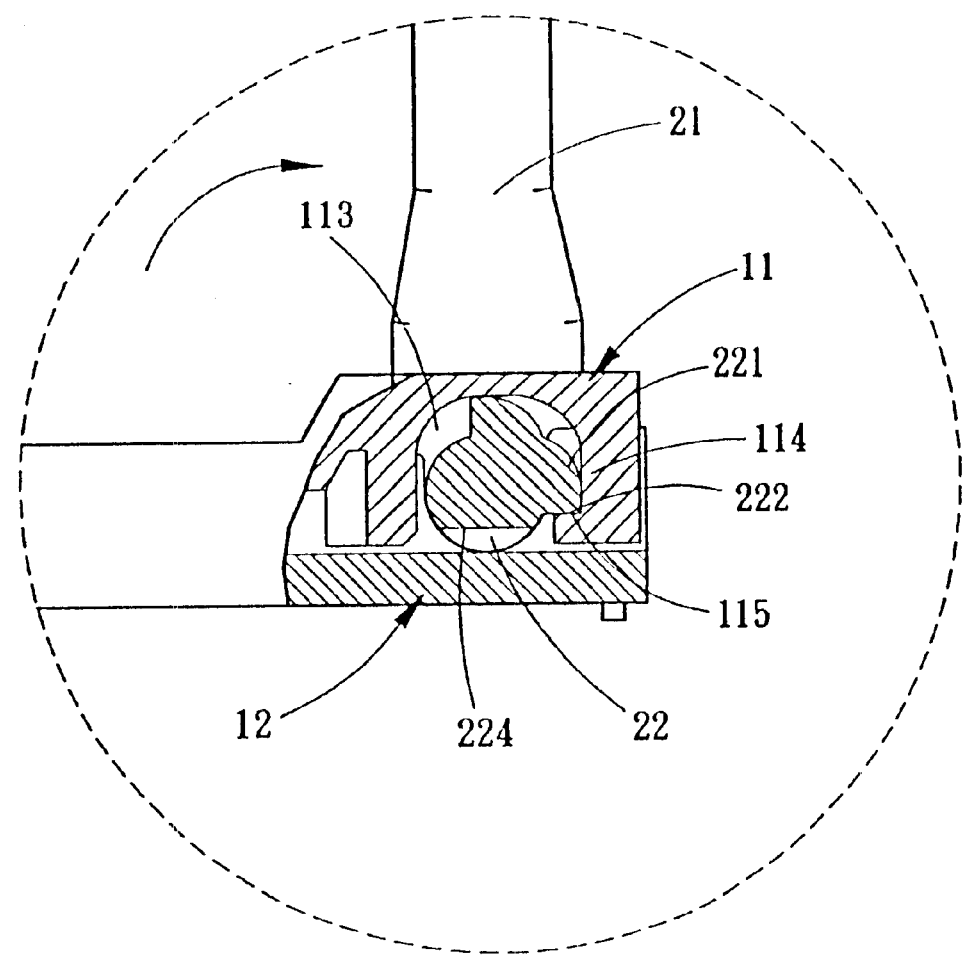

Referring to FIGS. 2-1, 2-2, 3-1 and 3-2, when the push lever 21 of the stir device 2 is turned to an upright position, the tooth part 221 at the urging plane 222 can press the resistant part 115 of the recess wall 114 such that the upper cover 11 is actuated to move toward the base seat 12. In this way, the upper cover 11 can engage with base seat 12 firmly.

Further, the actuation rod 22 at a proper position thereof has a anti-slip part 222 and the receiving space 122 on the base seat 12 has an anti-slip recess 123 corresponding to the anti-slip part 222 so that the stir device 2 can be prevented from moving away the connector 1. Besides, in order to limit the turning angle, which the stir device 2 is turned, a lateral end of the base seat 12, which is close to the rotational axis of the stir device 2, provides a block piece 124 against the push lever 21 for limiting the turning angle.

In addition, the upper cover 11 at a lateral side thereof next to the push lever 21 extends outward a stopper 116 and the push lever has a locating recess 211 corresponding to the stopper 116. In order to facilitate the push lever being operated, a trigger part 222 can be arranged at a tail end of the actuation rod 22.

It is appreciated from the preceding detailed description that a reinforced connector on an integrated circuit chip according to the present invention provides at least a tooth part on an actuation rod of a stir device to press a resistant part of the recess wall on a tooth recess disposed at the inner side of an upper cover on the connector. Thus, once a push lever of the stir device can be turned an upright position, an urging plane of the tooth part can press against the resistant part such that upper cover can be actuated to move toward a base seat of the connector to prevent the upper cover from excessively loosening during horizontally displacing with respect to the base seat.

While the invention has been described with reference to the a preferred embodiment thereof, it is to be understood that modifications or variations may be easily made without departing from the spirit of this invention, which is defined by the appended claims.

What is claimed is:

1. A reinforced connector on an integrated circuit chip, comprising an upper cover, having a receiving space;

a base seat, being disposed under the upper cover, having another receiving space corresponding to the receiving space of the upper cover; and a stir device, being arranged in the receiving spaces and further comprising a push lever and an actuation rod being fixedly attached thereto characterized in that the actuation rod has at least one tooth part with an urging plane at a lateral side thereof, the receiving space in the upper cover having a meshing recess to accommodate the tooth part and the meshing recess at an outer side thereof having a groove wall with an inner edge thereof having a resistant part corresponding to the urging plane;

whereby, once the push lever of the stir device is turned to an upright position, the urging plane of the tooth part can press the resistant part of the recess wall in the meshing groove to move the upper cover toward the base seat for the upper cover to pressingly engage with the base seat firmly.

2. The reinforced connector on an integrated circuit chip as defined in claim 1, wherein the actuation rod is provided with an anti-slip part and an anti-slip recess is provided on the receiving spaces of the upper cover and the base seat respectively corresponding to the anti-slip part.

3. The reinforced connector on an integrated circuit chip as defined in claim 1, wherein the upper cover at a lateral side thereof next to the push lever has a stopper and the push lever has a locating recess corresponding to the stopper.

4. The reinforced connector on an integrated circuit chip as defined in claim 1, wherein in order to facilitate the push lever being turned, the push lever at an end thereof is provided with a trigger head.

5. The reinforced connector on an integrated circuit chip as defined in claim 1, wherein the base seat at a lateral side thereof next to a rotational axis of the stir device provides a stopper block in order to limit the turning angle.

6. The reinforced connector on an integrated circuit chip as defined in claim 1, wherein the actuation rod has a recess part to facilitate rotation of the actuation rod in order to prevent the actuation rod interfering with the resistant part.

* * * * *